United States Patent
Laursen et al.

(10) Patent No.: US 6,821,794 B2
(45) Date of Patent: Nov. 23, 2004

(54) FLEXIBLE SNAPSHOT IN ENDPOINT DETECTION

(75) Inventors: Thomas Laursen, Phoenix, AZ (US); Mamoru Yamayoshi, Phoenix, AZ (US)

(73) Assignee: Novellus Systems, Inc., San Jose, CA (US)

( * ) Notice: Subject to any disclaimer, the term of this patent is extended or adjusted under 35 U.S.C. 154(b) by 119 days.

(21) Appl. No.: 10/264,590

(22) Filed: Oct. 4, 2002

(65) Prior Publication Data

US 2003/0087459 A1 May 8, 2003

Related U.S. Application Data (60) Provisional application No. 60/327,070, filed on Oct. 4, 2001.

(51) Int. Cl.[7] .................................................. H01L 21/00
(52) U.S. Cl. ........................ 438/8; 438/7; 438/692; 438/691; 438/14; 438/16; 438/690; 451/5; 216/2; 216/99; 216/96; 216/84
(58) Field of Search .............................. 438/8, 7, 692, 438/691, 14, 16, 690; 451/5; 216/2, 99, 96, 84

(56) References Cited

U.S. PATENT DOCUMENTS

| | | |
|---|---|---|
| 5,498,196 A | 3/1996 | Karlsrud et al. |
| 5,554,064 A | 9/1996 | Breivogel et al. |
| 5,582,534 A | 12/1996 | Shendon et al. |
| 5,692,947 A | 12/1997 | Talieh et al. |
| 5,707,274 A | 1/1998 | Kim et al. |
| 5,846,882 A * | 12/1998 | Birang .......................... 438/692 |
| 5,872,633 A | 2/1999 | Holzapfel et al. |
| 5,882,243 A * | 3/1999 | Das et al. ....................... 451/5 |
| 5,916,016 A | 6/1999 | Bothra |
| 5,938,884 A | 8/1999 | Hoshizaki et al. |
| 5,941,758 A | 8/1999 | Mack |
| 5,964,653 A | 10/1999 | Perlov et al. |
| 5,985,679 A * | 11/1999 | Berman .......................... 438/7 |
| 6,309,261 B1 | 10/2001 | Chadbourne |
| 6,361,646 B1 | 3/2002 | Bibby, Jr. et al. |
| 6,379,980 B1 * | 4/2002 | Toprac .......................... 438/8 |
| 6,383,058 B1 | 5/2002 | Birang et al. |
| 6,424,137 B1 * | 7/2002 | Sampson .................. 324/76.21 |
| 6,491,569 B2 * | 12/2002 | Bibby et al. .................... 451/6 |
| 6,534,328 B1 * | 3/2003 | Hewett et al. .................. 438/8 |
| 6,547,637 B1 * | 4/2003 | Zhang ........................... 451/5 |
| 6,628,410 B2 * | 9/2003 | Doan ........................ 356/630 |
| 2002/0032499 A1 * | 3/2002 | Wilson et al. .............. 700/159 |
| 2002/0071128 A1 * | 6/2002 | Doan ........................ 356/630 |

* cited by examiner

*Primary Examiner*—Matthew Smith
*Assistant Examiner*—Victor V Yevsikov
(74) *Attorney, Agent, or Firm*—Ingrassia Fisher & Lorenz PC (57) ABSTRACT

A system and method for determining endpoint detection in semiconductor wafer planarization is provided. The system and method provide a flexible solution that can compensate for baseline variability induced errors that may otherwise occur in endpoint detection. The system uses an endpoint detection signal that monitors the optical characteristics of the wafer being planarized. The system and method continue to monitor the detection signal during planarization until it meets endpoint criterion that indicates endpoint completion. When the endpoint criterion is reached, a new snapshot is taken from a previous time period and a new baseline is calculated. The endpoint detection signal is then recalculated based upon the new baseline and the recalculated detection signal is again compared to the endpoint criterion. If the recalculated endpoint detection signal again substantially meets the endpoint criterion then the detection of endpoint is confirmed. If the recalculated detection signal no longer meets the endpoint criterion, the planarization process continues with the new baseline used as the basis for endpoint detection.

24 Claims, 4 Drawing Sheets

FLEXIBLE SNAPSHOT IN ENDPOINT DETECTION

CROSS-REFERENCES TO RELATED APPLICATIONS

This application claims the benefit of U.S. Provisional Application No. 60/327,070, filed Oct. 4, 2001.

FIELD OF THE INVENTION

The present invention generally relates to semiconductor manufacturing and more specifically relates to monitoring planarization of a wafer.

BACKGROUND OF THE INVENTION

The need to remain cost and performance competitive in the production of semiconductor devices has caused continually increasing device density in integrated circuits. To facilitate the increase in device density, new technologies are constantly needed to allow the feature size of semiconductor devices to be reduced. These include improved manufacturing systems and techniques. One notable manufacturing process is that of planarization.

Planarization is the process of removing projections and other imperfections to create a flat planar surface, both locally and globally, and/or the removal of material to create a uniform clearing of a deposited thin film layer on a wafer. Semiconductor wafers are planarized or polished to achieve a substantially smooth cleared patterned surface as part of process steps that create the integrated circuitry or interconnects on the wafer. A considerable amount of effort in the manufacturing of modem complex, high density multilevel interconnects is devoted to the planarization of the individual layers of the interconnect structure. Nonplanar surfaces create poor optical resolution of subsequent photolithography processing steps. Poor optical resolution prohibits the printing of high-density lines. Another problem with nonplanar surface topography is the step coverage of subsequent metalization layers. If a step height is too large there is a serious danger that open circuits will be created. Planar surface layers are required in the fabrication of modern high-density integrated circuits. To this end, chemical-mechanical planarization (CMP) tools have been developed to provide controlled planarization of both structured and unstructured wafers.

CMP consists of a chemical process and a mechanical process acting together, for example, to reduce height variations across a dielectric region, clear metal deposits in damascene processes or remove excess oxide in shallow trench isolation fabrication. The chemical-mechanical process is achieved with a liquid medium containing chemicals that react with the front surface of the wafer when it is mechanically stressed during the planarization process.

In a conventional CMP tool for planarizing a wafer, a wafer is secured in a carrier connected to a shaft. The shaft is typically connected to mechanical means for transporting the wafer between a load or unload station and a position adjacent to a polishing pad mounted to a rigid or flexible platen or supporting surface. Pressure is exerted on the back surface of the wafer by the carrier in order to press the front surface of the wafer against the polishing pad, usually in the presence of slurry. The wafer and/or polishing pad are then moved in relation to each other via motor(s) connected to the shaft and/or supporting surface in order to remove material in a planar manner from the front surface of the wafer.

It is often desirable to monitor the front surface of the wafer during the planarization process. One known method is to use an optical system that monitors the front surface of the wafer in situ by positioning an optical probe under the polishing pad. Laser interferometry, signal template matching and multifrequency analysis techniques, as well as others, are known monitoring methods. The signal from the probe may be transmitted and received through an opening in the polishing pad. The opening in the polishing pad may be filled with an optically transparent material, or "window", in order to prevent polishing slurry or other contaminants from being deposited into the probe and obscuring the optical path to the wafer. The data from the optical system is typically analyzed by a control system to determine the current condition of the front surface of the wafer. This allows the system to terminate the planarization process (call end-point) once the front surface of the wafer has reached a desired condition.

A reliable end-point detection system is desirable for maintaining an optimum CMP process. The end-point system detects the point in the planarization process when the overburden being polished is removed everywhere across the wafer. Excessive removal of overburden from the front surface of the wafer, whether a raw sheet film, or an STI, metal or dielectric layer structure on the front wafer surface, may damage the wafer.

One area of particular concern in end-point detection systems is the spectral shape variations. For example, in the spectral shape can be caused by factors such as staining in the pad window or by variations in particle concentrations at the pad-wafer interface. These spectral variations can cause the endpoint signal to drift, and can create false-positives in the end-point detection system, resulting in premature stopping of the CMP process.

What is needed is an improved system for monitoring the front surface of a wafer during a planarization process that compensates for spectral shape variations to more accurately provide end-point detection.

Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

The present invention provides a system and method for determining endpoint detection in semiconductor wafer planarization. The system and method provide a flexible solution that can compensate for baseline variability induced errors that may otherwise occur in endpoint detection.

The system uses an endpoint detection signal that monitors the optical characteristics of the wafer being planarized. The system and method continue to monitor the detection signal during planarization until it meets endpoint criterion that indicates endpoint completion. When the endpoint criterion is reached, a new snapshot is taken from a previous time period and a new baseline is calculated. The endpoint detection signal is then recalculated based upon the new baseline and the recalculated detection signal is again compared to the endpoint criterion. If the recalculated endpoint detection signal again substantially meets the endpoint criterion then the detection of endpoint is confirmed. If the recalculated detection signal no longer meets the endpoint criterion, the planarization process continues with the new baseline used as the basis for endpoint detection.

The system and method thus allow the use of new baseline values to serve as the basis for endpoint detection. The use of the new baseline serves to compensate for variability in the optical characteristics of the system. For example, it can be used to compensate for variability due to staining of the pad window and/or particle concentration variations at the pad-wafer interface. By compensating for variability, the system and method provides improved endpoint detection in the planarization process.

The foregoing and other objects, features and advantages of the invention will be apparent from the following more particular description of a preferred embodiment of the invention, as illustrated in the accompanying drawings.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The present invention provides a system and method for determining endpoint detection in semiconductor wafer planarization. The system and method provide a flexible solution that can compensate for baseline variability induced errors that may otherwise occur in endpoint detection.

The system uses an endpoint detection signal that monitors the optical characteristics of the wafer being planarized. The system and method continue to monitor the detection signal during planarization until it meets endpoint criterion that indicates endpoint completion. When the endpoint criterion is reached, a new snapshot is taken from a previous time period and a new baseline is calculated. The endpoint detection signal is then recalculated based upon the new baseline and the recalculated detection signal is again compared to the endpoint criterion. If the recalculated endpoint detection signal again substantially meets the endpoint criterion then the detection of endpoint is confirmed. If the recalculated detection signal no longer meets the endpoint criterion, the planarization process continues with the new baseline used as the basis for endpoint detection.

The system and method thus allow the use of new baseline values to serve as the basis for endpoint detection. The use of the new baseline serves to compensate for variability in the optical characteristics of the system. For example, it can be used to compensate for variability due to staining of the pad window and/or particle concentration variations at the pad-wafer interface. By compensating for variability, the system and method provides improved endpoint detection in the planarization process.

Figure 1:
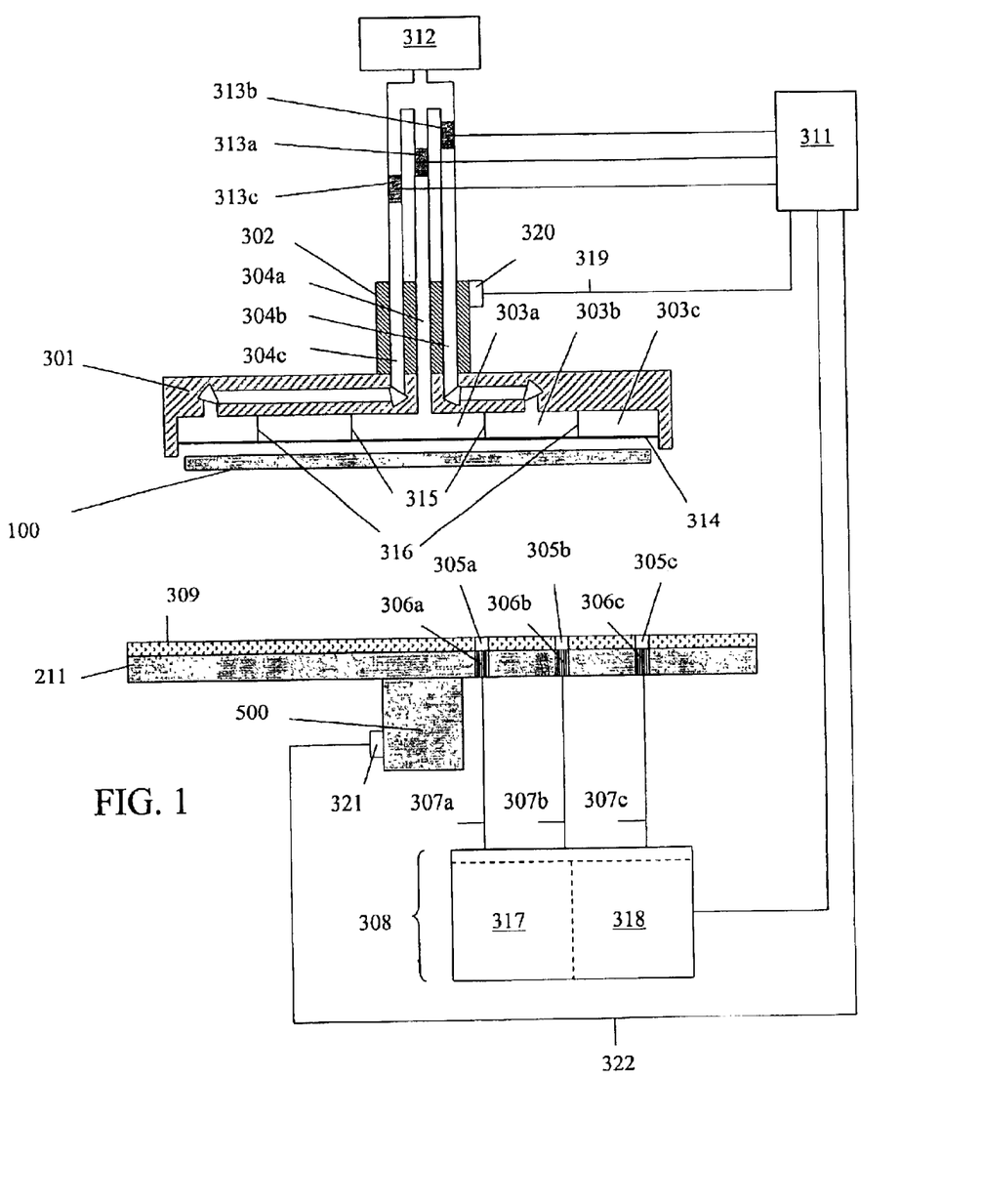
FIG. 1 is a simplified cross section view of a planarization apparatus.
Figure 2:
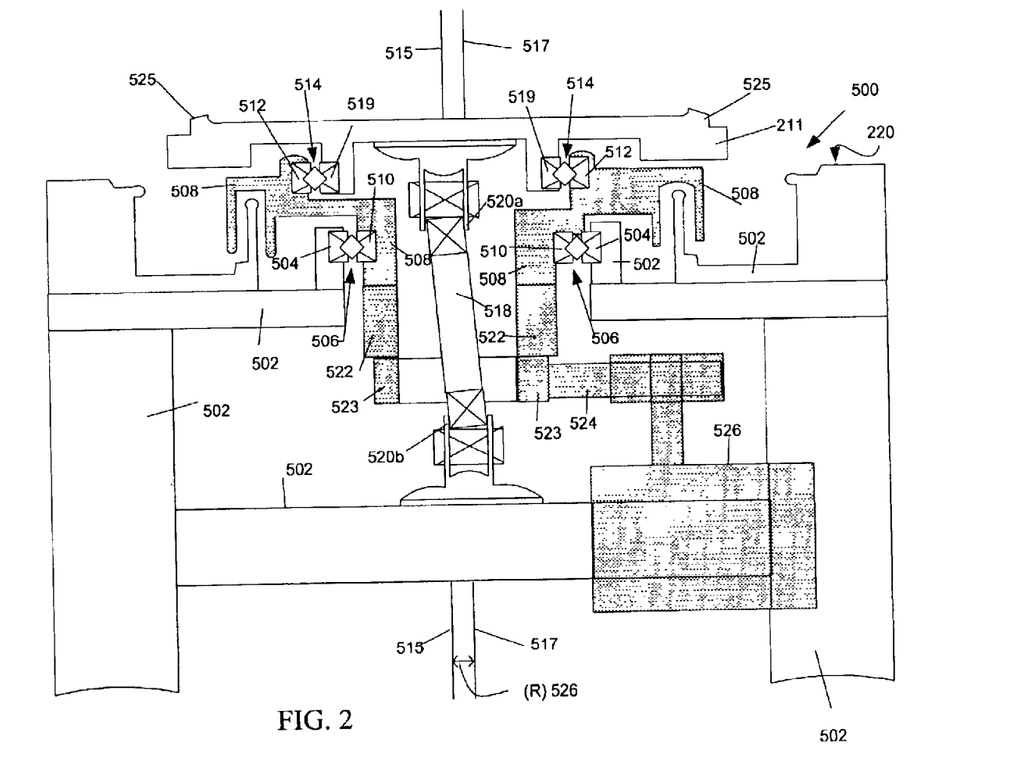
FIG. 2 is a cross sectional view of an apparatus for producing an orbital motion.

A detailed description of an exemplary planarization system and method will now be given with reference to FIGS. 1 and 2. The planarization system described with reference to FIGS. 1 and 2 is just one example of the types of planarization systems that can used with the endpoint detection system and method. It should also be understood that in the following description, numerous specific details are set forth illustrating Applicant's best mode for practicing the present invention and enabling one of ordinary skill in the art to make and use the present invention. It will be known, however, to one skilled in the art that the present invention may be practiced without these specific details. In other instances, well-known machines and process steps have not been described in particular detail in order to avoid unnecessarily obscuring the present invention.

An apparatus for practicing the present invention will now be discussed with reference to FIG. 1. During a planarization process, a wafer 100 may be transported by a carrier 301 to a position adjacent and substantially parallel to a working surface or polishing pad 309. The front surface of the wafer 100 is pressed against the polishing pad 309 fixed to a supporting surface 211, preferably in the presence of a slurry (not shown). The front surface of the wafer 100 is planarized by generating relative motion between the front surface of the wafer 100 and the polishing pad 309 thereby removing material from the front surface of the wafer 100.

The system includes a plurality of probes 305a–c positioned beneath the polishing pad 309 to transmit light to, and receive reflected light from, the front surface of the wafer 100. Three probes 305a–c are illustrated in FIG. 1, however, any number of probes may be used. The greater the number of probes, the faster a complete scan of the wafer may generally be taken, but each additional probe increases the expense and complexity of the system. The probes 305a–c are preferably bifurcated to allow separate optical paths for the transmitted and reflected light. A light source 317 creates the light signal and a spectrometer 318 may be used to assist in analyzing the reflected light. Each probe 305a–c may be positioned to transmit light to, and receive reflected light from, a particular annular band on the front surface of the wafer 100. If an orbital CMP tool is used having a relatively small orbital radius, each probe 305a–c may be used to monitor a single annular band. The annular bands in such an orbital CMP tool may be made to overlap to insure the entire front surface of the wafer 100 is being monitored. Analysis of the reflected light may then be used to alter the planarization process. For example, a planarization process parameter may be adjusted or the pressure exerted on the back surface of the wafer 100 may be altered by a multizone carrier 301.

The carrier 301 is preferably rotated about its central axis as it presses the front surface of the wafer 100 against the polishing pad 309 during the planarization process. The rotational speed of the carrier 301 is preferably selected to optimize the planarization process. The optimum rotational speed for the planarization process may be determined through computer models or by empirical means. Rotational speeds of about 12 rpm for the carrier 301 have been found to produce satisfactory planarization results while permitting the transmittance and reception of reflected light from the front surface of the wafer 100. The carrier 301 may also be moved along the polishing pad 309 to enhance the planarization process of the wafer 100.

The carrier 301 may be adapted to permit biasing the pressure exerted on different areas of the back surface of the wafer 100. Areas on the back surface of the wafer 100 receiving a higher (or lower) pressure will typically increase (or decrease) the removal rate of material from corresponding areas on the front surface of the wafer 100. Removal rates of material from planarization processes are typically substantially uniform within concentric annular bands about the center of the wafer, but often differ greatly from band to band. To correct for this common problem, the carrier 301 is preferably capable of exerting different pressures in a plurality of different areas while maintaining a uniform pressure within each area. Since removal rates for planarization processes tend to be uniform within concentric bands on the front surface of the wafer 100, the carrier 301 is ideally able to apply a uniform pressure over each concentric band on the back surface of the wafer 100. In addition, since removal rates tend to differ from band to band on the front surface of the wafer 100, the carrier 301 is also ideally able to apply different pressures over different bands on the back surface of the wafer 100. Examples of such carriers are disclosed in U.S. Pat. No. 5,882,243; U.S. Pat. No. 5,916,016; U.S. Pat. No. 5,941,758; and U.S. Pat. No. 5,964,653 and are hereby incorporated by reference. The greater the number of concentric annular bands, the greater the process flexibility in adjusting the carrier 301 to the problems encountered in the planarization process. However, the complexity and cost of the carrier also increases as the number of adjustable bands increases. A carrier with three (3) adjustable concentric pressure bands is expected to give improved process flexibility while keeping the complexity of the carrier to a manageable level. Since the need for improved process results is almost certainly going to increase in the future, the preferred number of controllable bands within the carrier will also likely increase in the future.

A simplified view of one possible multizone carrier 301 that may be used with the invention is illustrated in FIG. 1. This illustrated carrier 301 has three concentric plenums: a central 303a, intermediate 303b and peripheral 303c plenum. A flexible membrane 314 provides a surface for supporting the wafer 100 while an inner 315 and an outer 316 ring provide barriers for separating the plenums 303a–c. The pressure within the central 303a, intermediate 303b and peripheral 303c plenums may be individually communicated through passageways 304a–c by respective controllable pressure regulators 313a–c connected to a pump 312. A rotary union 302 may be used in communicating the pressure from the pump 312 and pressure regulators 313a–c to their respective plenums 303a–c if the carrier 301 is rotated. A controller 311 may be used to automate the selected pressure for each pressure regulator 313a–c. Thus, each concentric plenum 303a–c may be individually pressurized to create three concentric bands to press against the back surface of the wafer 100. Each plenum 303a–c may therefore have a different pressure, but each concentric band will therefore have a uniform pressure within the band to press against the back surface of the wafer 100.

The invention may be used with a variety of polishing pads 309 that typically comprise a urethane-based material or other abrasive surfaces. Examples of conventional polishing pads 309 that may be used with the invention are an IC1000 or an IC1000 supported by a Suba IV polishing pad. Both of these polishing pads 309 and others are manufactured and made commercially available by Rodel, Inc. with offices in Phoenix, Ariz.

A supporting surface 211 may be used to support the abrasive surface or polishing pad 309. The supporting surface 211 may be a rigid substantially planar surface comprising aluminum, stainless steal, ceramic, titanium, polymer or other such rigid, non-corrosive material. Alternatively, the supporting surface 211 may comprise a diaphragm supported by pressurized fluids alone or in combination with other flexible layers. Both methods are known in the art for providing a supporting surface 211 for a polishing pad 309. A slurry delivery system (not shown) is preferably incorporated into the supporting surface 211 for delivery of slurry onto the polishing pad 309.

The supporting surface 211 may be connected to a motion generator 500 for creating relative motion between the front surface of the wafer 100 and the polishing pad 309. Various motions for the supporting surface 211 are already known. For example U.S. Pat. No. 5,498,196 shows an example of a rotational CMP tool; U.S. Pat. No. 5,692,947 shows an example of a linear belt system; U.S. Pat. No. 5,707,274 shows an example of a rotary drum system; and U.S. Pat. No. 5,554,064 shows an example of an orbital tool, all of which are hereby incorporated by reference. However, the supporting surface 211 is preferably moved in an orbital motion in a manner more fully explained below in the description of the motion generator 500.

U.S. Pat. No. 5,582,534 Shendon et al. and U.S. Pat. No. 5,938,884 Hoshizaki et al. disclose several mechanisms for creating an orbital motion for a carrier. The principles for the mechanisms disclosed for creating an orbital motion may be applied by one of ordinary skill in the art to create a motion generator 500 capable of orbiting the supporting surface 211 and polishing pad 309 and are hereby incorporated by reference.

FIG. 2 is a cross-sectional view of an exemplary motion generator 500 that may be used to generate an orbital motion for the supporting surface 211. The motion generator 500 is generally disclosed in U.S. Pat. No. 5,554,064 Breivogel et al. and is hereby incorporated by reference. Supporting base 220 may have a rigid frame 502 that can be securely fixed to the ground. Stationary frame 502 is used to support and balance motion generator 500. The outside ring 504 of a lower bearing 506 is rigidly fixed by clamps to stationary frame 502. Stationary frame 502 prevents outside ring 504 of lower bearing 506 from rotating. Wave generator 508 formed of a circular, hollow rigid stainless steel body is clamped to the inside ring 510 of lower bearing 506. Wave generator 508 is also clamped to outside ring 512 of an upper bearing 514. Wave generator 508 positions upper bearing 514 parallel to lower bearing 506. Wave generator 508 offsets the center axis 515 of upper bearing 514 from the center axis 517 of lower bearing 506. A circular supporting surface 211 is symmetrically positioned and securely fastened to the inner ring 519 of upper bearing 514. A polishing pad or pad assembly can be securely fastened to ridge 525 formed around the outside edge of the upper surface of the supporting surface 211. A universal joint 518 having two pivot points 520a and 520b is securely fastened to stationary frame 502 and to the bottom surface of the supporting surface 211. The lower portion of wave generator 508 is rigidly connected to a hollow and cylindrical drive spool 522 that in turn is connected to a hollow and cylindrical drive pulley 523. Drive pulley 523 is coupled by a belt 524 to a motor 526. Motor 526 may be a variable speed, three phase, two horsepower AC motor.

The orbital motion of supporting surface 211 is generated by spinning wave generator 508. Wave generator 508 is rotated by variable speed motor 526. As wave generator 508 rotates, the center axis 515 of upper bearing 514 orbits about the center axis 517 of lower bearing 506. The radius of the orbit of the upper bearing 517 is equal to the offset 527 between the center axis 515 of upper bearing 514 and the center axis 517 of the lower bearing 506. Upper bearing 514 orbits about the center axis 517 of lower bearing 506 at a rate equal to the rotation of wave generator 508. It is to be noted that the outer ring 512 of upper bearing 514 not only orbits but also rotates (spins) as wave generator 508 rotates. The function of universal joint 518 is to prevent torque from rotating or spinning the supporting surface 211. The dual pivot points 520a and 520b of universal joint 518 allow the supporting surface 211 to move in all directions except a rotational direction. By connecting the supporting surface 211 to the inner ring 519 of upper bearing 514 and by connecting universal joint 518 to the supporting surface 211 and stationary frame 502 the rotational movement of inner ring 519 and supporting surface 211 is prevented and supporting surface 211 only orbits as desired. The orbit rate of supporting surface 211 is equal to the rotation rate of wave generator 508 and the orbit radius of supporting surface 211 is equal to the offset of the center 515 of upper bearing 514 from the center 517 of lower bearing 506. The orbit rate of the supporting surface is preferably about 600 orbits per minute with a preferred orbit radius of less than 16 mm.

It is to be appreciated that a variety of other well-known means may be employed to facilitate the orbital motion of the polishing pad 309. While a particular method for producing an orbital motion has been given in detail, the present invention may be practiced using a variety of techniques for orbiting the polishing pad 309 on the supporting surface 211.

A metrology instrument, e.g. an endpoint detection system 308, may be used to analyze data from the front surface of a wafer 100. In one embodiment, the endpoint detection system includes multiple probes. Multiple probes allow samples to be taken at a desired density across the face of the wafer 100 in a shorter time than a single probe system, but increase the complexity of the system. This is accomplished since additional probes prevent or shorten the time when there are no probes under the front surface of the wafer 100 and may even allow multiple points to be sampled substantially simultaneously. It is highly desirable to take samples at a desired spatial density across the entire surface of the wafer 100 (a "scan") as quickly as possible to obtain the best possible data to analyze. The surface of the wafer 100 changes rapidly during the planarization process and a long interval between samples will result in the early measurements not accurately reflecting the condition of the wafer 100 when the later measurements are taken. Interpolation, extrapolation or modeling software may be used to make estimates that compensate for temporal variations in samples, but the preferred method is to complete the scan as quickly as possible.

As a specific example, a short scan time may help avoid dishing or erosion in a copper planarization process. Once an area has cleared (the material such as copper has been removed down to an underlying layer) a scan of the entire wafer is preferably completed with the desired resolution within the time necessary to prevent excessive erosion or dishing of features in the cleared area. Measurements are most important once an area has cleared to make sure the planarization process stops before that area or any other area experiences erosion or over-polishing.

The end-point detection system 308 may be used to determine areas on the front surface of the wafer 100 that need an increase or decrease in material removal rate. The areas that need an increase or decrease in material removal rate will typically take the form of concentric rings about an annular central region on the front surface of the wafer 100.

Figure 3:
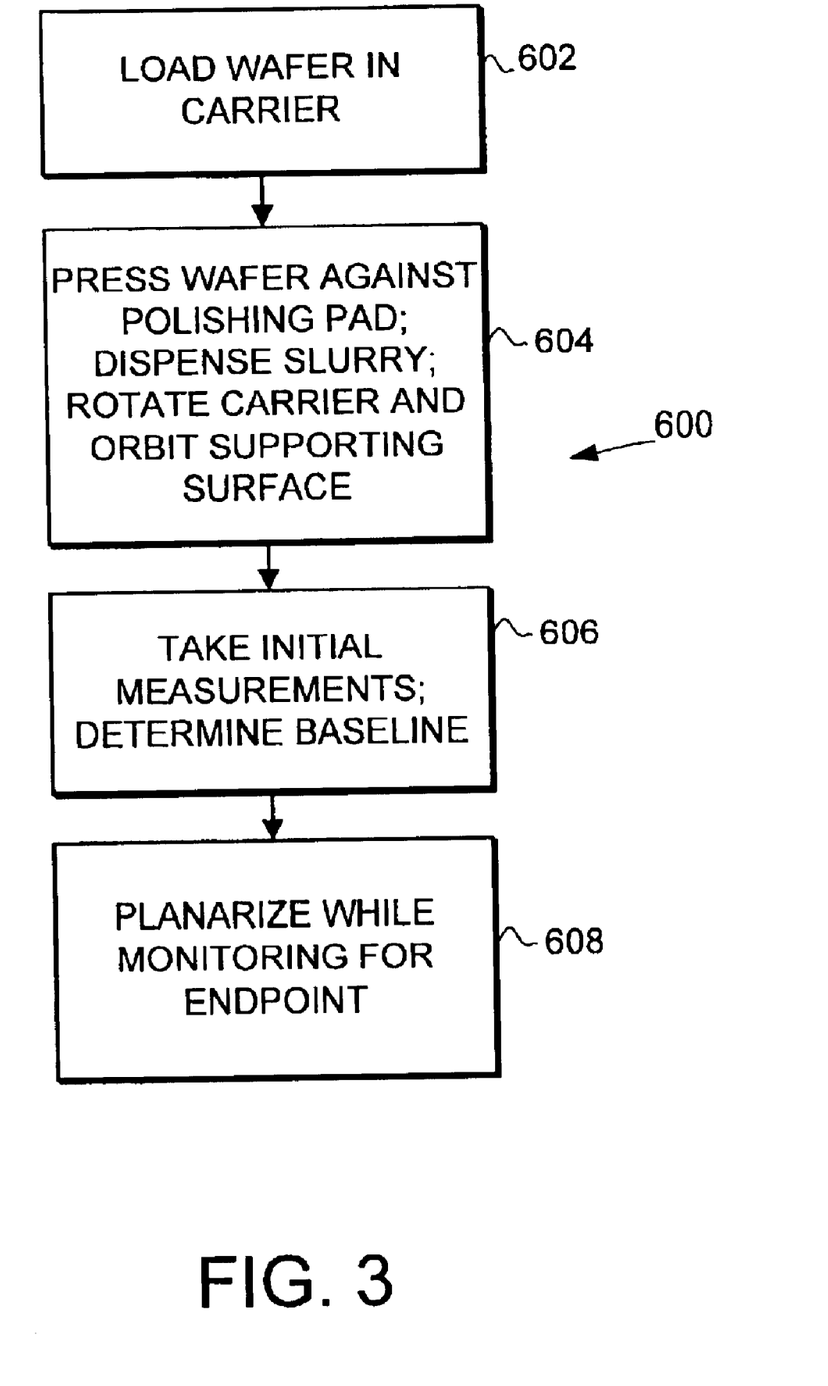
FIG. 3 is a flow diagram illustrating a planarization method.

An end-point detection system 308 is advantageous in CMP tools where a wafer does not remain over the same area of a polishing pad, as in a conventional rotational CMP tool. Multiple probes may be used to reduce the amount of time when no probe is under the wafer or may be used to increase the number of points sampled when more than one probe is under the wafer. An end-point detection system 308 is also advantageous in systems where the wafer remains substantially over the same area of a polishing pad, as in a conventional orbital system. As illustrated in FIG. 3, the probes 306a–c may be positioned where they are always, or almost always, under the wafer 100 thereby allowing multiple probes 306a–c to take samples substantially continuously. This highly efficient use of the probes 306a–c greatly reduces the time necessary to complete a scan and greatly increases the accuracy of the analysis of the front surface of the wafer 100 by limiting temporal differences in the samples.

Referring still to FIG. 1, an emitter or flash lamp 317 may be used to initiate a light signal to travel through one or more fiber optic cables 307a–c. One or more probes 306a–c may be used to receive and transmit the light signal through one or more holes or transparent areas 305a–c in the polishing pad 309 to the front surface of the wafer 100. The probes 306a–c are preferably positioned as close as possible to a transparent area 305a–c to enhance the optical communication. The reflected light signal from the wafer 100 may be captured by a probe 306a–c and routed to a metrology instrument 318, such as a spectrometer, via fiber optic cables 307a–c. The invention may be practiced with a variety of probes, flash lamps and fiber optic cables that are known in the art.

While measurement averaging or integration over a large area may be used to collect samples, a flash lamp 317 allows high-speed discrete measurements to be taken. Discrete measurements provide finer spatial resolution and are capable of detecting smaller residuals on the front surface of the wafer 100. The light signal is preferably a broad band spectrum of light so that the intensity of the reflected light signal may be analyzed at multiple wavelengths. The spectrum preferably includes light between 300 and 800 nm in wavelength. As a specific example, a Xe flash lamp 317 may be used to generate the light signal.

The flash duration of the flash lamp 317 should generally be as short as possible to minimize the amount of relative motion between the surface of the wafer and the flash lamp 317 and probe 306a–c during signal collection. Relative motion between the surface of the wafer 100 and the probe will create a smear effect and decrease the sensitivity of the measurement if the illumination were to endure over the relatively large duty cycle period of a grating spectrometer. The flash duration does need to be long and intense enough, however, to provide enough signal intensity for the probes 306a–c to collect the reflected light from the surface of the wafer 100. The flash duration is preferably less than about three microseconds.

The flash is optimally repeated as quickly as possible in order to gather the greatest amount of sample data. However, two factors limit the usefulness of extremely fast flash rates. The first is that each flash provides a tremendous amount of data that must be quickly analyzed. Data that has been gathered, but that cannot be timely analyzed does not benefit the system. The second factor is that some time must be allowed to pass between measurements in order for relative motion between the front surface of the wafer 100 and the probes 306a–c to move the measurement location. The measurements are preferably evenly distributed, and as close as possible, across the front surface of the wafer 100.

The spot size of light from the flash lamp 317 is preferably slightly larger than the largest copper feature that is supposed to remain on the surface of the wafer 100. This will prevent a fully planarized area from giving a false reading indicating that copper residuals remain. This could happen if a measurement were taken over a large copper feature, such as a bond pad, with a spot size smaller than the bond pad. On the other hand, a spot size that is too big may miss copper residuals that are smaller than the spot size. The optimum spot size is larger than the largest copper feature while also being smaller than the smallest copper residual it is required to detect. As feature sizes continue to decrease and the requirements for semiconductor manufacturing continue to become more stringent, the optimum spot size will decrease. A spot size of one to three mm in diameter is acceptable for most current semiconductor manufacturing requirements with smaller spot sizes likely required in the future.

There are preferably enough probes properly positioned in the CMP tool to allow sampling across the entire front surface of the wafer 100 during the planarization process. Typical orbital CMP tools, due to the small relative movements between the front surface of the wafer 100 and the polishing pad 309, need multiple probes that preferably have a slight overlap of coverage to insure all areas on the front surface of the wafer 100 are sampled. Each probe in a conventional orbital CMP tool, with a rotating carrier 301, will examine an annular band on the front surface of the wafer 100 approximately the width of the diameter of the orbit. Thus, all the data for a particular annular band on the front surface of the wafer 100 in a conventional orbital CMP tool comes from a single probe thereby simplifying the analysis of the data.

The metrology instrument 318, preferably a grating spectrometer(s), accepts the incoming reflected light signal and converts the light signal into data indicating the intensity of the reflected light at a plurality of different wavelengths. The data may then be transmitted to a control system 311 for analysis. The control system 311 is able to determine the condition of the front surface of the wafer 100 from the data. For example, a transition from a copper to a silicon dioxide surface may easily be detected with a broadband probe. The reflected signal itself may have monotonic characteristics when reflected from a metallic layer and sinusoidal characteristics when reflected from an oxide layer (or a nonmetallic layer). Specifically, the reflected signal may become sinusoidal in nature after the metallic layer has been cleared away and the oxide layer becomes the reflective surface.

A number of numerical methods may be used to determine when the planarization process should be terminated, i.e. end-point called. For example, end-point may be called after a predetermined over-polish time has occurred starting from the time a predetermined percentage of measurements show an absence of copper. The over-polish time insures a complete clearing of the copper. The over-polish time and the percentage of measurements showing an absence of copper are preferably determined empirically due to variations from planarization process to planarization process.

The control system 311 may make immediate adjustments to the planarization process based on the analysis of the measurements. For example, increasing or decreasing the pressure on the back surface of the wafer 100 during the planarization process has been found to increase or decrease, respectively, the removal rate at the periphery of the wafer 100 with respect to the center of the wafer 100. As another example, more or less slurry may be distributed near areas that have been found to need increased or decreased, respectively, removal rates. As yet another example, the rotation speed of the carrier 301 may be increased or decreased to increase or decrease, respectively, the removal rate at the periphery of the wafer 100. However, the preferred method is to use a multizone carrier 301 to alter the removal rate at different areas of the front surface of the wafer 100. Specifically, the pressure may be increased or decreased in zones over areas that need an increase or decrease in material removal rate, respectively, on the front surface of the wafer 100. In addition, the results from planarized wafers 100 may be used to change the process parameters for incoming wafers. This allows process drift within the planarization process to be detected and compensated for as it happens.

Examples of the types of probes, fiber optic cables, flash lamps and spectrometer that may be used in practicing the invention are available from Verity Instruments, Inc. headquartered in Dallas, Tex.

To determine the condition of the front surface of the wafer 100, the location for each measurement should be known. One possible method is to track only the radial position for each measurement and take at least one measurement at various radial positions in fine enough increments to provide a desired sampling resolution. This method assumes that each measurement accurately represents the condition of the wafer 100 at every point having the same radial position. Since wafers 100 generally have bands that planarize at approximately the same rate, this method provides a simple approximation of the condition of the front surface of the wafer 100. However, this method may miss areas that do not follow the normal band pattern. The preferred method is to track the position of each measurement in two axes on the front surface of the wafer 100. In this manner, measurements may be taken across the front surface of the wafer 100 at a desired spatial resolution that prevents a problem area larger than the desired resolution from going unobserved.

An illustrative method 600 for planarizing a wafer will now be described with reference to FIGS. 1 and 3. The first step 602 is for the wafer 100 to be placed in a carrier 301 and transported adjacent to a polishing pad 309. Next, in step 604, the carrier 301 holds the wafer 100 substantially parallel to the polishing pad 309 while the wafer 100 is pressed against the top surface of the polishing pad 309. Slurry is then dispensed between the polishing pad 309 and the wafer 100 for use as a polishing media. The carrier 301 can then be rotated or otherwise moved in relation to the polishing pad 309 to assist in uniformly removing material from the front surface of the wafer 100. The supporting surface 211 and attached polishing pad 309 may also be moved in relation to the front surface of the wafer 100 and is preferably orbited. The relative motion in step 604 between the pad and the wafer is used to remove material from the front surface of the wafer 100 and thus planarize wafer 100.

After an initial time period of planarization, the next step 606 is to take a set of initial measurements and determine a baseline for the planarization process. These and later measurements can be taken by the endpoint system 308 and its associated probes 306a–c. These probes monitor the surface of the wafer during the planarization process. As an example, the endpoint system 308 may reflect a light signal off the front surface of the wafer using flash lamp 317. A detector, such as spectrometer 318 may be used to convert the reflected light into data representing the intensity of light at a plurality of wavelengths. The flash lamp 317 and spectrometer 318 can provide a string of optical measurement data used to monitor the progress of the planarization. For example, the flash lamp 317 can provide flashes of about 3 $\mu$s in duration repeated at approximately 100 ms intervals for all three probes 306a–c. The optical measurement data resulting from these flashes can then be used as a basis for an endpoint detection signal that is passed to the control system 311 to monitor the progress of the planarization.

In step 606, the initial optical measurements taken by the endpoint system 308 are used to determine the baseline. The baseline is a set of initial data used as a reference by the endpoint system 308 to determine if the sampled portion of the wafer has been cleared by planarization. The set of initial optical measurement data used to create the baseline can be generally referred to as a snapshot. The initial data set is obtained shortly after planarization has begun but is preferably taken closer to clearing but well before planarization has caused clearing of any part of the wafer. This allows the optical measurement to be taken after the polish has broken in and become substantially stable but before any amount of the wafer has been cleared. Thus, the initial data snapshot can provide a baseline that will provide an accurate representation of the optical data from a wafer still covered in deposited material. This baseline can then be used as a reference by the endpoint system to determine whether or not subsequent samples indicate that the sampled portion of the wafer has been cleared.

Typically, the snapshot comprises a set of optical measurements are taken to determine the baseline. For example, a set of 30 initial measurements can be taken and averaged to create the baseline. Averaging a large set of initial measurements reduces the possibility of anomalous readings affecting the baseline and thus increases the accuracy of the baseline. Preferably, a snapshot is taken and a baseline determined for each of the three probes 306a–c. This improves the accuracy of each probe used in endpoint detection and thus improves the overall accuracy of the system.

When the initial measurements are taken and the baseline determined, the next step 608 is to continue planarization while monitoring for endpoint. In general, the probes 306a–c provides a substantially continuous measurement of the optical properties of the wafer. These subsequent optical measurements are compared to the baseline to determine if they indicate that the sampled portion of the wafer has been cleared. As planarization progresses portions of wafer begin to be cleared of material. When subsequent optical measurements indicate that an endpoint criterion has been met, an endpoint detection signal is outputted that indicates an endpoint has been reached and the system 311 will stop planarization within a defined period of time. An example of a suitable endpoint criterion that can be used is a percentage of clearing or a percentage of remaining coverage. For example, a percentage of remaining coverage that could satisfy an endpoint criteria could be between 5 and 20 percent. When optical measurements indicate that the percentage of remaining coverage has dropped below the selected percentage, the endpoint detection signal will call an endpoint. With the endpoint reached, planarization can be stopped after a short over polish time and the wafer may then be removed from the CMP tool and replaced with another.

One type of optical measurement that can be used is broadband measurements of spectra. Other types of optical measurement that can be used include single wavelength based intensity measurements.

A detailed example of an endpoint detection method will be now be given. Those skilled in the art will recognize that the claimed invention applies to other methods of endpoint detection that use different measurement and analysis techniques. In this example the measurement data used to monitor the planarization progress comprise a series of spectral measurements that each indicate the spectra of light reflected from a portion of the wafer. These optical measurements are normalized by comparing it to a baseline, such as the baseline determined during initialization. The normalized optical measurements are subjected to a Fourier transform. The Fourier transform of each normalized optical measurement can be analyzed to determine if the portion of the wafer examined by the measurement has been cleared. A series of Fourier transformed measurements can thus be used to determine the percentage of clearing and provide the endpoint detection signal.

The optical measurement data can be normalized by dividing the optical measurement data by the baseline determined from the initial snapshot of optical measurement data taken during initialization. As stated above, the initial snapshot of data is preferably taken a certain time after planarization has begun to allow the polish become stable but before any portion of the wafer has been cleared. The initial snapshot will thus provide an accurate representation of the optical characteristics of the wafer still covered in deposited material. The snapshot can thus be used to provide a baseline for the normalization of later optical measurements. The baseline is thus used to determine when a measurement of data indicates that a portion of the wafer has cleared.

The normalized optical data provides the advantage of demonstrating a clear transition during planarization. The normalized optical data initially comprises substantially flat straight lines. This occurs because early in the planarization process the optical measurement data is substantially unchanged from the initial snapshot. As material is removed by the planarization process, the optical measurement data changes and the normalized measurement data goes from substantially straight lines to including non-linearities (e.g., oscillations) that arise from exposed portions of the wafer. This system has the advantage of strong robustness because the endpoint detection is based on a pronounced shape change that occurs in the normalized optical measurements.

As mentioned above, one method of monitoring the normalized optical measurements for this shape change is using a Fourier transform analysis. As an example, a Fourier transform of the normalized spectra measurement provides a curve that can be analyzed for non-linearities and/or oscillations that would indicate clearing.

Initially, the Fourier transform of the normalized optical data would be approximately zero. As planarization progresses and portions of the wafer are exposed, the Fourier transform of the normalized optical data provides a waveform that increases with clearing. Typically, the Fourier transform is analyzed by finding the maximum value of the Fourier transform in a specified interval and comparing that maximum value to a threshold.

The Fourier transform analysis can thus be used to facilitate the determination of whether or not the sampled wafer portion has cleared. One example of an endpoint criterion is when the defined percentage of Fourier transformed samples over a specified time period indicate that the wafer has been cleared. For example, a running average of Fourier transformed optical data taken over a period of approximately five seconds allows a reasonable estimate of the fraction cleared based on the statistics of about 50 measurements.

Figure 4:
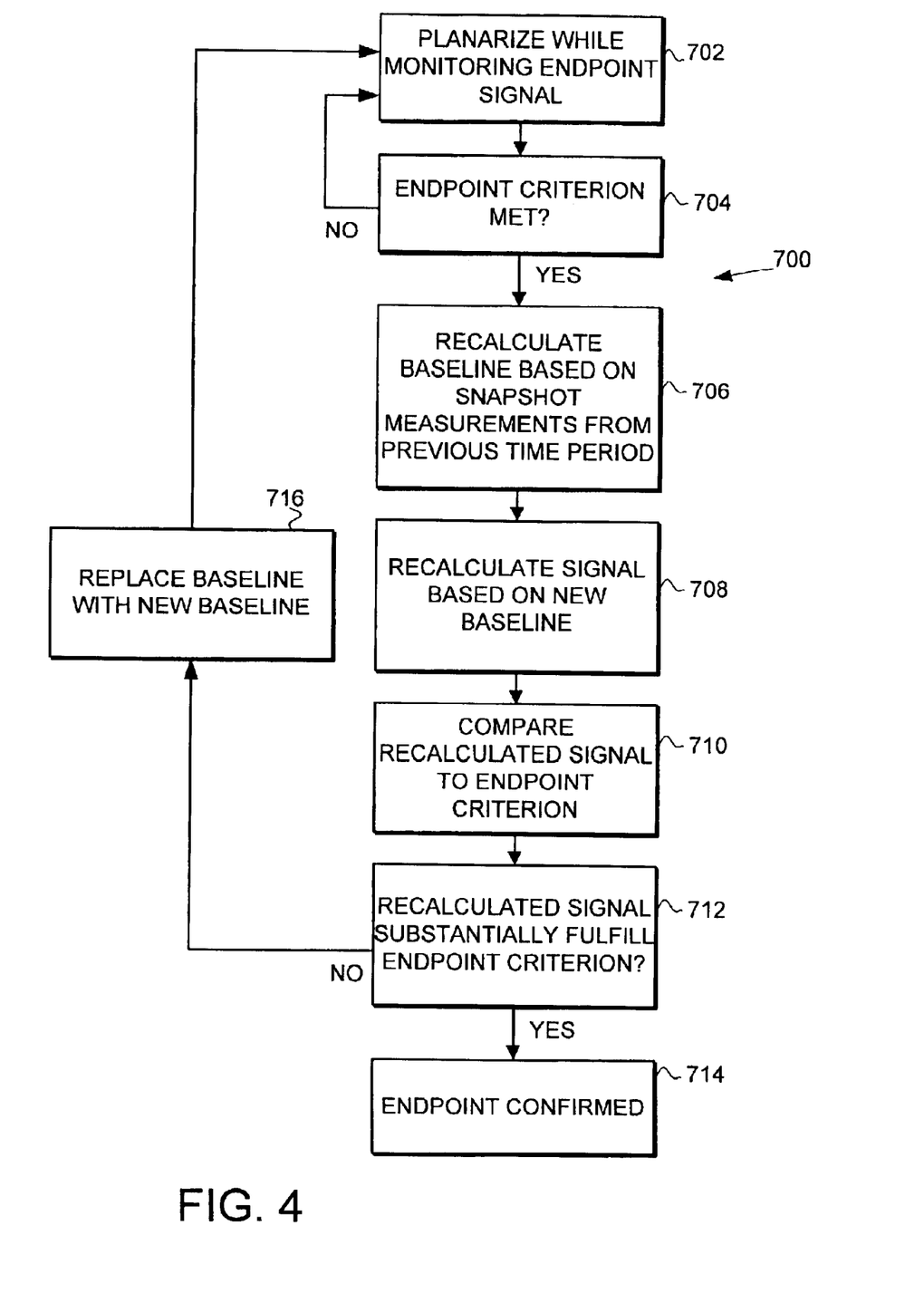
FIG. 4 is a flow diagram illustration a method for monitoring and detecting endpoint in a planarization process.

Turning now to FIG. 4, a method 700 is illustrated for monitoring the planarization of a wafer. As such, method 700 is a more detailed example of a process that can be used to perform step 608 of FIG. 2. Again, method 700 can be used with a planarization system such as that illustrated in FIGS. 1 and 2, but could also be used with other types of wafer planarization systems. In general, method 700 uses an endpoint detection signal that monitors the optical characteristics of the wafer being planarized. The method continues to monitor the detection signal during planarization until it meets an endpoint criterion that indicates endpoint completion. When the endpoint criterion is reached, a new snapshot is taken from a previous time period and a new baseline is calculated. The endpoint detection signal is then recalculated based upon the new baseline and the recalculated detection signal is again compared to the endpoint criterion. If the recalculated endpoint detection signal again substantially meets the endpoint criterion then the detection of endpoint is confirmed. If the recalculated detection signal no longer substantially meets the endpoint criterion, the planarization process continues with the new baseline used as the basis for endpoint detection.

As stated above, the endpoint detection signal is preferably derived from the measurement data taken by the one or more probes in the CMP system. The endpoint detection signal can be any suitable signal that describes the progress of planarization and facilitates comparison to an endpoint criterion. In the example stated above, the endpoint detection signal can indicate the percentage of wafer that has been cleared and the endpoint criterion can comprise a selected percentage of clearing.

In method 700, the first step 702 is to planarize while monitoring an endpoint detection signal. In step 704, the method checks to determine if the endpoint detection signal meets the endpoint criterion that indicate planarization is nearing or at completion. If the endpoint criterion is not met, the method returns to step 702. If the endpoint criterion is met, the method passes to step 706. Thus, method 700 continues to planarize and monitor the endpoint signal until the endpoint criterion is met.

In the optical measurement analysis implementation described above, steps 702 and 704 are implemented by comparing received optical measurements to the baseline. Again, this can be done by normalizing each optical measurement with respect to the baseline. Each normalized optical measurement can then be subjected to a Fourier transform to give a quantifiable indication as to whether the measurement indicates that the sampled portion of the wafer has been cleared. Also in the example above, the endpoint criterion can be met when a defined percentage of optical measurements indicate that the sampled portion of the wafer has been cleared.

When the endpoint criterion is met, the next step 706 is to recalculate the baseline based on a snapshot from a previous time period. The new snapshot and baseline are to be used to confirm that the called endpoint is valid.

To perform this step, previous measurement data is used that has been obtained and stored during the planarization process. Specifically, a portion of the measurement data that was taken during planarization will now be used as a new snapshot to determine a new baseline. The new snapshot is taken from measurement data taken after the original snapshot time but before the endpoint criterion was met. The exact time period from which measurement data will be used for the new snapshot would depend upon several factors. Generally, it is the goal to take the new snapshot at a time period when it is known that wafer was still covered by material but after window staining or other variations may have occurred which may caused the signal to drift into error. In one implementation, measurement data used for the new snap shot is taken from optical measurement data taken a fixed time period before the endpoint was called. For example, the new snapshot can be determined from data taken 3, 5 or 10 seconds before the call of endpoint. Generally speaking, shorter time periods are preferably for situations in which signal drift is increasing at a rapid rate. Thus, when window staining creates rapid increases in signal drift it is desirable measurements from a relatively short time before the call of endpoint. In situations when drift is increasing at a lower rate, the large time periods are generally desirable. The exact time period selected could change from wafer to wafer, batch to batch, or be consistent depending upon application details.

In another implementation, instead of using measurement data from a fixed time before endpoint as the basis for the new snapshot, the new snapshot is determined from a data taken at a fixed percentage of endpoint call time. For example, the new snapshot can be taken at 70 percent of the endpoint call time. Using a relative time period as the basis for the new snapshot has the advantage of simplicity and low computational requirements, but the disadvantage of not being as likely to work with large amounts of drift.

In both embodiments, measurement data from the selected previous time period is as the snapshot to determine the new baseline. As such, the new baseline will compensate for any drift that has occurred up to this point. Stated another way, the new snapshot provides a baseline of the optical characteristics of an uncleared wafer when viewed through the conditions at the time of the new snapshot. Thus, the new baseline provides a baseline of the optical characteristics of an uncleared wafer when viewed through a stained pad window or through particle concentration variations at the pad wafer interface. This is based on the observation that drift caused by pad window staining, particle concentration or slurry color variations generally increases at a slower rate then data changes caused by actual wafer clearing. Thus, the new snapshot is preferably taken from measurement data when the wafer was still covered by material but after window staining or other variations has caused signal drift to start to occur.

With the new baseline recalculated, the next step 708 is to recalculate the endpoint signal based on the new baseline. In the preferred embodiment, this is done by renormalizing with the new baseline the optical measurement data taken after the new snapshot and the endpoint call. The Fourier transform of the renormalized optical measurement data is recalculated and analyzed. The endpoint detection signal can then be recalculated from the new measurements. In the example above, the endpoint detection signal can be recalculated to indicate the percentage of optical measurements that indicate clearing based on the new baseline.

The next step 710 is to compare the recalculated signal to the endpoint criterion. Because the recalculated endpoint detection signal is based on measurements that have been normalized using the new baseline, it can confirm whether the original endpoint call is valid. As stated above, the new baseline provides a representation of the wafer before it was cleared but after some drift may have occurred. Thus, the new baseline compensates for drift by providing normalization to optical measurements taken after the drift, if any, has started to occur. Thus, if the original endpoint call was based on drift and not clearing then the recalculated endpoint detection signal will not fulfill the endpoint criterion. Conversely, if the original endpoint call was based on clearing, the recalculated endpoint detection signal will confirm the clearing.

It should be noted that in some cases the comparison taken between the endpoint detection signal and the endpoint criterion would not be the same comparison made earlier. For example, it may be desirable to conclude that the endpoint criterion was fulfilled if the recalculated endpoint detection signal meets a defined percentage of the original endpoint criterion. For example, if the recalculated endpoint detection signal meets 90 percent of the original endpoint criterion the endpoint criterion could be considered met. This essentially results in more sensitive comparison to the endpoint criterion. Conversely, comparison could be made less sensitive by comparing to 110 percent of the original endpoint criterion. Finally, a new endpoint criterion altogether could be used in this comparison.

In decision step 712, if the recalculated endpoint detection signal fulfills the endpoint criterion then endpoint is confirmed and the method passes to step 714. Planarization will then be stopped within a selected time period.

Conversely, if the recalculated endpoint detection signal does not fulfill the endpoint criterion, then the endpoint was not valid and the method passes to step 716. At step 716, the old baseline is replaced with the new baseline calculated in step 706. This new baseline will then be used as the basis for normalization as planarization continues. This use of the new baseline helps compensate for the drift that caused the false endpoint to be detected.

The method returns to step 702 where planarization continues and monitoring of endpoint signal is done with calculations based on the new baseline. When the endpoint criterion is again met, steps 706–712 will again evaluate the endpoint call to determine if the call was based on actual clearing or upon error induced drift. The process will thus continue until a valid endpoint is confirmed and the planarization process stopped.

The present invention thus provides a system and method for determining endpoint detection in semiconductor wafer planarization. The system and method provide a flexible solution that can compensate for baseline variability induced errors that may otherwise occur in endpoint detection. The system and method can thus improve endpoint detection to help satisfy the ever increasing demands for improved manufacturing reliability and efficiency.

While the invention has been described with regard to specific embodiments, those skilled in the art will recognize that changes can be made in form and detail without departing from the spirit and scope of the invention.

What is claimed is:

1. A method comprising the steps of:
    a) monitoring an endpoint detection signal in a wafer planarization process to determine when the endpoint detection signal meets an endpoint criterion;
    b) calculating a new baseline for the endpoint detection signal when the endpoint detection signal meets the endpoint criterion; and
    c) recalculating the endpoint detection signal based on the new baseline.

2. The method of claim 1 further comprising the step of comparing the recalculated endpoint detection signal to the endpoint criterion.

3. The method of claim 2 further comprising the step of continuing planarization and continuing monitoring if the recalculated endpoint detection signal is less than a defined percentage of the endpoint criterion.

4. The method of claim 3 wherein the continuing monitoring comprises monitoring using the new baseline.

5. The method of claim 1 wherein the step of comparing the recalculated endpoint detection signal to the endpoint criterion comprises comparing the recalculated endpoint detection signal to a defined percentage of the endpoint criterion.

6. The method of claim 1 wherein the step of calculating a new baseline comprises calculating the new baseline from data obtained in a previous time period.

7. The method of claim 6 wherein the previous time period is a time period determined as a percentage of a total planarization time.

8. The method of claim 6 wherein the previous time period is a period a selected time before the endpoint signal meets the endpoint criterion.

9. The method of claim 1 wherein the step of recalculating the endpoint detection signal based on the new baseline comprises renormalizing optical data using the new baseline.

10. The method of claim 9 wherein the step of recalculating the endpoint detection signal based on the new baseline further comprises a Fourier transform of the renormalized optical data.

11. The method of claim 1 wherein the endpoint criterion comprises a percentage of wafer clearing.

12. A method comprising the steps of:
    a) monitoring an endpoint detection signal in a wafer planarization process to determine when the endpoint detection signal meets an endpoint criterion;
    b) calculating a new baseline for the endpoint detection signal when the endpoint detection signal meets the endpoint criterion, the new baseline determined from a previous time period;
    c) recalculating the endpoint detection signal based on the new baseline;
    d) comparing the recalculated endpoint detection signal to the endpoint criterion; and
    e) continuing wafer planarization and continuing monitoring the endpoint detection signal if the recalculated endpoint detection signal does not substantially meet the endpoint criterion, the continued monitoring of the endpoint detection signal based on the new baseline.

13. The method of claim 12 wherein the previous time period is determined as a percentage of a total planarization time.

14. The method of claim 12 wherein the previous time period is determined as a specified time period before endpoint criterion was met.

15. The method of claim 12 wherein the step of recalculating the endpoint detection signal based on the new baseline comprises renormalizing optical data using the new baseline and wherein the step of recalculating the endpoint detection signal based on the new baseline further comprises a Fourier transform of the renormalized optical data.

16. The method of claim 12 wherein the step of monitoring an endpoint detection signal comprises the step of creating the endpoint detection signal by making a plurality of optical measurements and normalizing optical data from the plurality of optical measurements with an original baseline.

17. The method of claim 12 wherein the step of comparing the recalculated endpoint detection signal to the endpoint criterion comprises comparing the recalculated endpoint detection signal to a defined percentage of the endpoint criterion.

18. A method comprising the steps of:
    a) taking a plurality of optical measurements of a wafer in a wafer planarization process, the plurality of optical measurements providing optical data indicative of the wafer;
    b) normalizing the optical data with respect to a first baseline;
    c) creating an endpoint detection signal from the normalized optical data, the endpoint detection signal indicating wafer planarization status;
    d) monitoring the endpoint detection signal during the wafer planarization process to determine when the endpoint detection signal meets an endpoint criterion;

e) calculating a new baseline when the endpoint detection signal rises meets the endpoint criterion, the new baseline calculated from a portion of the plurality of optical measurements taken during a time period previous to the endpoint detection signal meeting the endpoint criterion;

f) renormalizing at least a portion of the optical data with respect to the new baseline;

g) recalculating the endpoint detection signal based on the renormalized portion of the optical data;

h) comparing the recalculated endpoint detection signal to endpoint criterion; and i) continuing wafer planarization and continuing monitoring the endpoint detection signal if the recalculated endpoint detection signal does not substantially meet the endpoint criterion.

19. The method of claim 18 wherein the time period previous is a time period determined as a percentage of a total planarization time.

20. The method of claim 18 wherein the time period previous is a period of selected time before the endpoint signal meets the endpoint criterion.

21. The method of claim 18 wherein the step of recalculating the endpoint detection signal based on the new baseline further comprises a Fourier transform of the renormalized optical data.

22. The method of claim 18 wherein the step of continuing wafer planarization and continuing monitoring the endpoint detection signal comprises continued monitoring of the endpoint detection signal based on the new baseline.

23. The method of claim 18 wherein the endpoint criterion comprises a percentage of wafer clearing.

24. The method of claim 18 wherein step of comparing the recalculated endpoint detection signal to the endpoint criterion comprises comparing the recalculated endpoint detection signal to a defined percentage of the endpoint criterion.

* * * * *